(12) United States Patent
Yoshida et al.

(10) Patent No.: US 10,408,619 B2
(45) Date of Patent: Sep. 10, 2019

(54) COMPOSITE SENSOR

(71) Applicants: DENSO CORPORATION, Kariya, Aichi-pref. (JP); SEIKO EPSON CORPORATION, Tokyo (JP)

(72) Inventors: Naoki Yoshida, Kariya (JP); Takashi Aoyama, Chino (JP); Jun Uehara, Fujimi-machi (JP)

(73) Assignees: DENSO CORPORATION, Kariya (JP); SEIKO EPSON CORPORATION, Tokyo (JP)

( * ) Notice: Subject to any disclaimer, the term of this patent is extended or adjusted under 35 U.S.C. 154(b) by 134 days.

(21) Appl. No.: 15/541,773

(22) PCT Filed: Dec. 25, 2015

(86) PCT No.: PCT/JP2015/006468
§ 371 (c)(1),
(2) Date: Jul. 6, 2017

(87) PCT Pub. No.: WO2016/113828
PCT Pub. Date: Jul. 21, 2016

(65) Prior Publication Data
US 2018/0003501 A1    Jan. 4, 2018

(30) Foreign Application Priority Data
Jan. 16, 2015   (JP) ................. 2015-007030

(51) Int. Cl.
*G01C 19/5705*   (2012.01)
*G01P 1/02*   (2006.01)
(Continued)

(52) U.S. Cl.
CPC ..... *G01C 19/5705* (2013.01); *G01C 19/5621* (2013.01); *G01C 19/5628* (2013.01);
(Continued)

(58) Field of Classification Search
CPC .... G01P 15/0802; G01P 15/125; G01P 15/18; G01P 1/02; G01P 1/023; G01C 19/5705;
(Continued)

(56) References Cited

U.S. PATENT DOCUMENTS 9,778,279 B2 * 10/2017 Ohkoshi ............... B81B 7/0058
2004/0177691 A1 * 9/2004 Kunda ................ B60R 21/0132
73/514.35
(Continued)

FOREIGN PATENT DOCUMENTS

JP    4543816 B2    9/2010
JP    2014-013207   1/2014

*Primary Examiner* — Helen C Kwok
(74) *Attorney, Agent, or Firm* — Posz Law Group, PLC

(57) ABSTRACT

A composite sensor includes a first sensor outputting a first sensor signal, a second sensor outputting a second sensor signal, a circuit board electrically connected to the first and second sensors, and a mount member having one surface on which the first and second sensors and the circuit board are disposed. The first and second sensors have respective input terminals to which respective input signals are inputted, and have respective output terminals from which the first and second sensor signals are outputted. When a virtual straight line passing respective centers of the first and second sensors parallel to an arrangement direction of the sensors is defined, the respective input terminals of the first and second sensors are disposed in one of two regions divided by the virtual line, and the respective output terminals of the first and second sensors are disposed in a remaining one of the two regions.

7 Claims, 8 Drawing Sheets

(51) Int. Cl.
   *G01C 19/5621* (2012.01)
   *G01C 19/5628* (2012.01)
   *G01P 15/125* (2006.01)
   *H01L 41/047* (2006.01)
   *H01L 41/053* (2006.01)
   *H01L 41/09* (2006.01)
   *H01L 41/113* (2006.01)
   *G01P 15/08* (2006.01)

(52) U.S. Cl.
   CPC ............ *G01P 1/02* (2013.01); *G01P 15/0802* (2013.01); *G01P 15/125* (2013.01); *H01L 41/047* (2013.01); *H01L 41/053* (2013.01); *H01L 41/09* (2013.01); *H01L 41/113* (2013.01); *G01P 2015/0814* (2013.01); *H01L 41/1132* (2013.01)

(58) Field of Classification Search
   CPC ............ G01C 19/5621; G01C 19/5628; G01C 19/5607
   See application file for complete search history.

(56) References Cited

U.S. PATENT DOCUMENTS

| | | | |
|---|---|---|---|
| 2006/0053908 A1* | 3/2006 | Ishigami | B60C 23/0408 73/866.1 |
| 2006/0082260 A1 | 4/2006 | Kinoshita | |
| 2010/0147072 A1* | 6/2010 | Matsunaga | G01C 19/5783 73/504.08 |
| 2011/0209815 A1* | 9/2011 | Aono | G01C 19/56 156/146 |
| 2013/0340524 A1* | 12/2013 | Maeda | G01P 15/0888 73/514.02 |
| 2014/0260612 A1* | 9/2014 | Aono | G01C 19/5783 73/504.12 |
| 2015/0040670 A1* | 2/2015 | Yamanaka | G01C 19/5783 73/514.35 |
| 2015/0268266 A1* | 9/2015 | Furuhata | G01P 15/08 73/504.03 |
| 2015/0355220 A1* | 12/2015 | Kang | G01P 15/123 73/504.12 |
| 2016/0327391 A1* | 11/2016 | Saito | H01L 25/0657 |
| 2017/0115116 A1* | 4/2017 | Ide | G01C 19/5628 |
| 2018/0245919 A1* | 8/2018 | Yoshida | B81B 7/0058 |

* cited by examiner

COMPOSITE SENSOR

CROSS REFERENCE TO RELATED APPLICATIONS

This application is a U.S. national stage application of International Patent Application No. PCT/JP2015/006468 filed on Dec. 25, 2015 and is based on Japanese Patent Application No. 2015-007030 filed on Jan. 16, 2015, the disclosure of which is incorporated herein by reference.

TECHNICAL FIELD

The present disclosure relates to a composite sensor including first and second sensors each detecting a different subject and both mounted on a common mount member.

BACKGROUND ART

Patent Literature 1 proposes an exemplary composite sensor in the related art of the above-described type. In this composite sensor, an acceleration sensor outputting a sensor signal corresponding to acceleration and an angular velocity sensor outputting a sensor signal corresponding to an angular velocity are mounted on one surface of a common mount member. More specifically, the composite sensor includes the acceleration sensor and the angular velocity sensor both of which are connected to the same one surface of the common mount member via connection members each provided by a conductive member or the like. The connection member connecting the angular velocity sensor and the one surface of the mount member is configured to be higher than the connection member connecting the acceleration sensor and the one surface of the mount member. The angular velocity sensor is of, for example, a piezoelectric type using a piezoelectric effect of a piezoelectric body. During a vibrating state of a drive vibrating reed, the angular velocity sensor outputs a sensor signal (electric charges) corresponding to an angular velocity applied to the sensor.

Because the connection member connecting the angular velocity sensor and the mount member is higher than the connection member connecting the acceleration sensor and the mount member, transmission of vibrations of the angular velocity sensor to the acceleration sensor can be restricted. Thus, this configuration can restrict a noise caused by the vibration of the angular velocity sensor from being applied to the acceleration sensor.

PATENT LITERATURE

Patent Literature 1: JP 2014-13207 A

SUMMARY

While the composite sensor of Patent Literature 1 is capable of restricting the noise caused by the vibration of the angular velocity sensor from being applied to the acceleration sensor, no consideration is given to a locational relation of the acceleration sensor and the angular velocity sensor, and detection accuracy may possibly be deteriorated by electrical noise.

For example, a capacitive acceleration sensor has a movable electrode and a fixed electrode opposing the movable electrode and either one of the movable electrode and the fixed electrode has predetermined amplitude and frequency. That is to say, an input signal (carrier wave) is applied to the one electrode, and acceleration is detected according to electric charges (sensor signal) generated at the other electrode. A piezoelectric angular velocity sensor has a drive vibrating reed and a detection vibrating reed, and an angular velocity is detected according to electric charges (sensor signal) generated at the detection vibrating reed while an input signal (carrier wave) having predetermined amplitude and frequency on the drive vibrating reed.

Electric charges generated at the other electrode of the acceleration sensor and electric charges generated at the detection vibrating reed of the angular velocity sensor are susceptible to an external interference. Input signals inputted to the acceleration sensor and the angular velocity sensor readily become a noise source. Hence, detection accuracy may possibly be deteriorated depending on an input signal when a portion of the acceleration sensor to which an input signal is inputted and a portion of the angular velocity sensor from which a sensor signal is outputted are disposed in close proximity to each other. The detection accuracy may also possibly be deteriorated depending on an input signal when a portion of the acceleration sensor from which a sensor signal is outputted and a portion of the angular velocity sensor to which an input signal is inputted are disposed in close proximity to each other.

In view of the foregoing difficulties, it is an object of the present disclosure to provide a composite sensor capable of restricting deterioration of detection accuracy caused by electrical noise.

According to an aspect of the present disclosure, a composite sensor includes: a first sensor outputting a first sensor signal corresponding to a detection subject; a second sensor outputting a second sensor signal corresponding to a detection subject different from the detection subject of the first sensor; a circuit board electrically connected to the first sensor and the second sensor; and a mount member having one surface. The first sensor, the second sensor, and the circuit board are disposed on the one surface of the mount member. The first sensor and the second sensor have respective input terminals to which respective input signals having predetermined amplitudes and predetermined frequencies are inputted. The first sensor and the second sensor have respective output terminals, the first sensor signal is outputted from the output terminal of the first sensor, and the second sensor signal is outputted from the output terminal of the second sensor.

When viewed in a direction normal to the one surface, the first sensor and the second sensor are arranged along a direction. A virtual line is defined by a straight line which passes respective centers of the first sensor and the second sensor and is parallel to an arrangement direction of the first sensor and the second sensor. The respective input terminals of the first sensor and the second sensor are disposed in one of two regions divided by the virtual line, and the respective output terminals of the first sensor and the second sensor are disposed in a remaining one of the two regions divided by the virtual line.

According to the configuration as above, the acceleration sensor and the angular velocity sensor are located in such a manner that the respective input terminals to which the input signals having predetermined amplitude and frequency are inputted are disposed on a same side while the respective output terminals from which the sensor signals are outputted are disposed on another same side. In other words, the input terminals into which the input signals that become a noise source are inputted are disposed on a same side and the output terminals from which the sensor signals susceptible to noise are outputted are disposed on another same side. That is to say, the input terminals into which the input signals that become a noise source are inputted and the output terminals from which the sensor signals susceptible to noise are outputted are disposed apart from each other. Hence, an adverse effect caused by an input signal inputted into the input terminal on a sensor signal outputted from the output terminal can be restricted. Consequently, deterioration of detection accuracy can be restricted.

BRIEF DESCRIPTION OF DRAWINGS

The above and other objects, features and advantages of the present invention will become more apparent from the following detailed description made with reference to the accompanying drawings. In the drawings.

DETAILED DESCRIPTION

Figure 1:
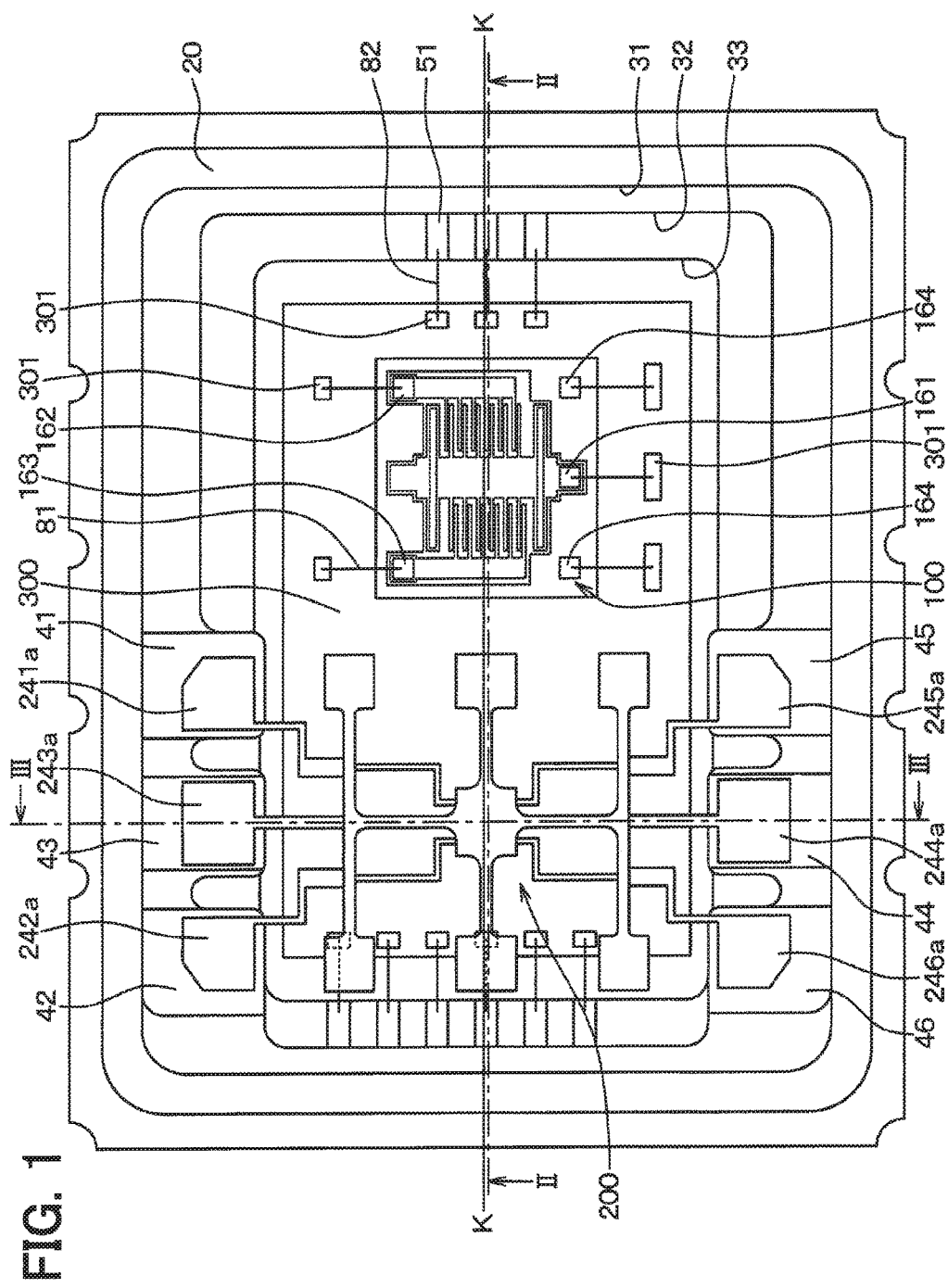
FIG. 1 is a top view of a composite sensor according to a first embodiment of the present disclosure.

Hereinafter, embodiments of the present disclosure will be described according to the drawings. In respective embodiments below, a description will be given by labeling same or equivalent portions with a same reference numeral.

First Embodiment

Figure 2:
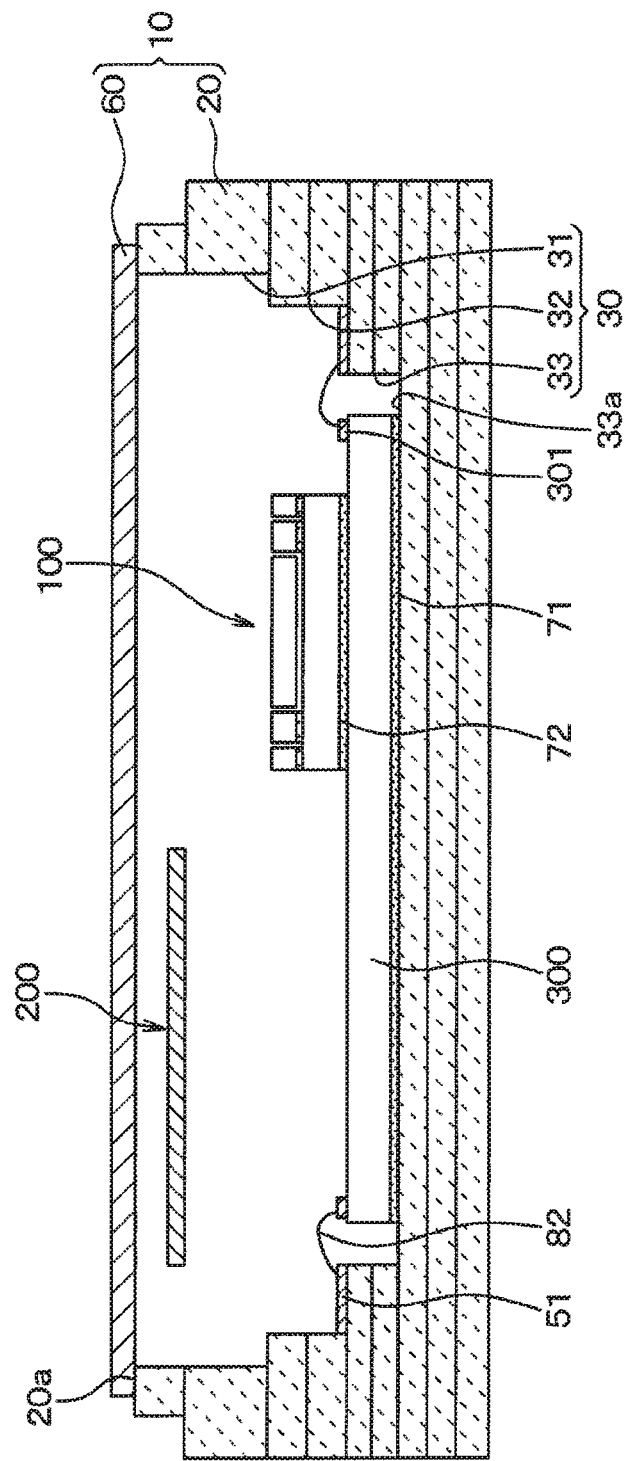
FIG. 2 is a sectional view taken along the line II-II of FIG. 1.
Figure 3:
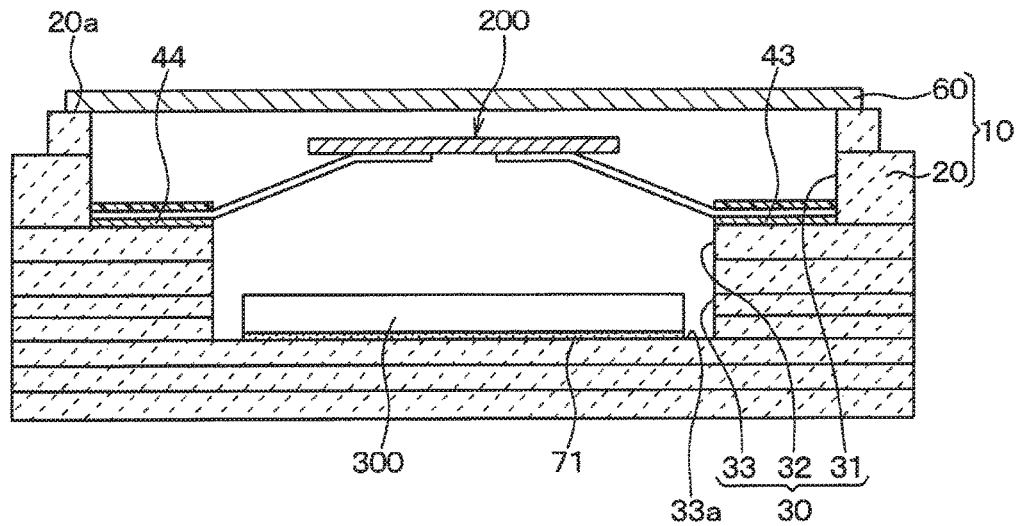
FIG. 3 is a sectional view taken along the line III-III of FIG. 1.

A first embodiment of the present disclosure will be described with reference to the drawings. In the present embodiment, as are shown in FIG. 1 through FIG. 3, a composite sensor includes a package 10 as a mount member, an acceleration sensor 100, an angular velocity sensor 200, and a circuit board 300 performing predetermined processing on the acceleration sensor 100 and the angular velocity sensor 200. In the present embodiment, the acceleration sensor 100 corresponds to a first sensor of the present disclosure, and the angular velocity sensor 200 corresponds to a second sensor of the present disclosure. A lid 60 described below is omitted in FIG. 1.

Figure 4:
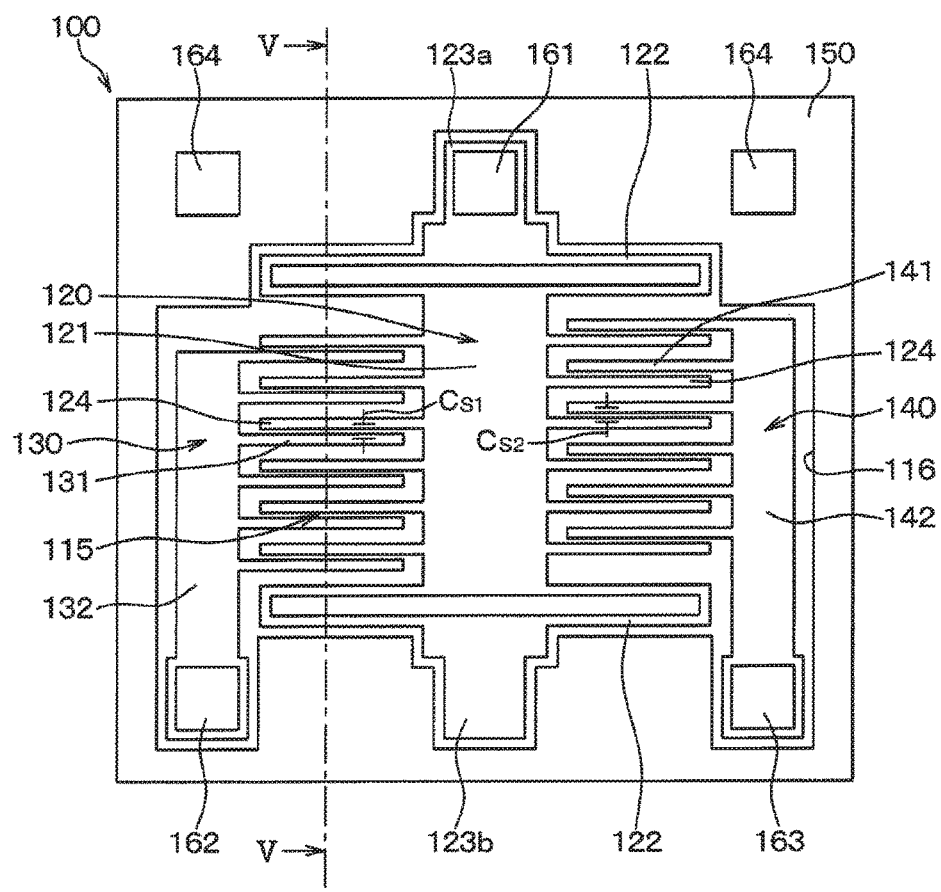
FIG. 4 is a top view of a sensor portion in an acceleration sensor.
Figure 5:
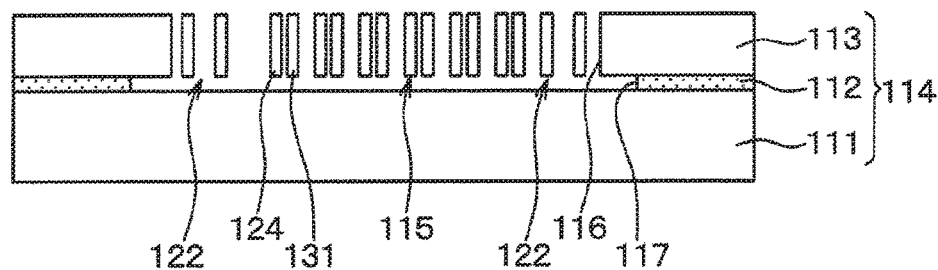
FIG. 5 is a sectional view taken along the line V-V of FIG. 4.

A configuration of the acceleration sensor 100 of the present embodiment will be described first. The acceleration sensor 100 of the present embodiment is known as a capacitive type acceleration sensor, and outputs a first sensor signal of the present disclosure. In the present embodiment, as are shown in FIG. 4 and FIG. 5, the acceleration sensor 100 includes an SOI (Silicon on Insulator) substrate 114 having a rectangular planar shape. The SOI substrate 114 includes a semiconductor layer 113 laminated on a support substrate 111 via an insulation film 112. For example, a silicon substrate is used as the support substrate 111, a film of $SiO_2$ or SiN is used as the insulation film 112, and a silicon or polysilicon substrate is used as the semiconductor layer 113.

The SOI substrate 114 is manufactured by a micromachine in a known manner, and has a sensing portion 115. More specifically, by providing a groove portion 116 in the semiconductor layer 113, a movable portion 120 having a comb-teeth beam structure, first fixed portions 130, and second fixed portions 140 are formed. The beam structure functions as the sensing portion 115 which outputs a sensor signal corresponding to detected acceleration. A portion of the semiconductor layer 113 surrounding the movable portion 120, the first fixed portions 130, and the second fixed portions 140 within the groove portion 116 is referred to as a peripheral portion 150.

The insulation film 112 is provided with an opening 117 at a portion corresponding to a region where the beam structure is disposed. With the above-described configuration, a predetermined region of the movable portion 120 and the first and second fixed portions 130 and 140 in the semiconductor layer 113 is afloat from the support substrate 111.

The movable portion 120 is disposed across the opening 117 and includes a rectangular weight portion 121. Both ends of the weight portion 121 in a longitudinal direction are integrally coupled to respective anchor portions 123a and 123b via respective beam portions 122. The anchor portions 123a and 123b are supported on the support substrate 111 via the insulation film 112 close to rim portions of the opening 117. The weight portion 121 and the beam portions 122 thus face the opening 117.

The beam portion 122 is of a rectangular frame shape having two parallel beams coupled to each other at respective both ends, and has a spring function to be displaced in a direction perpendicular to a longitudinal direction of the two beams. More specifically, the beam portion 122 forces the weight portion 121 to be displaced in the longitudinal direction of the weight portion 121 upon receipt of acceleration containing a component in a direction parallel to the longitudinal direction of the weight portion 121. The beam portion 122 also allows the weight portion 121 to restore to an original state when the acceleration vanishes. Hence, the weight portion 121 coupled to the support substrate 111 via the beam portion 122 configured as above undergoes displacement in a same displacement direction as the beam portion 122 upon application of acceleration.

The movable portion 120 includes multiple movable electrodes 124 provided integrally with the weight portion 121, and the movable electrodes protrude from both side surfaces of the weight portion 121 in opposite directions which are perpendicular to the longitudinal direction of the weight portion 121. In FIG. 4, six movable electrodes 124 are provided to protrude on each of a left side and a right side of the weight portion 121, and face the opening 117. The respective movable electrodes 124 are provided integrally with the weight portion 121 and the beam portion 122 and displace together with the weight portion 121 in the longitudinal direction of the weight portion 121 when the beam portion 122 is displaced.

The first and second fixed portions 130 and 140 are supported on the support substrate 111 via the insulation film 112, and are disposed close to opposing rim portions of the opening 117 where the anchor portions 123a and 123b are not disposed. In short, the first and second fixed portions 130 and 140 are disposed to sandwich the movable portion 120.

In FIG. 4, the first fixed portion 130 is disposed on a left side of the movable portion 120 on a sheet surface, and the second fixed portion 140 is disposed on a right side of the movable portion 120 on the sheet surface. The first and second fixed portions 130 and 140 are electrically independent from each other.

The first and second fixed portions 130 and 140 respectively have multiple first and second fixed electrodes 131 and 141, and the fixed electrodes 131, 141 are disposed opposite to and parallel to side surfaces of the movable electrodes 124 at predetermined detection intervals. The first and second fixed portions 130 and 140 respectively have first and second wiring portions 132 and 142 supported on the support substrate 111 via the insulation film 112.

In the present embodiment, as is shown in FIG. 4, six first fixed electrodes 131 and six second fixed electrodes 141 are provided and aligned like comb teeth to mesh with clearances of the comb-teeth of the movable electrodes 124. The first and second fixed electrodes 131 and 141 are supported in a cantilever manner by the wiring portions 132 and 142, respectively, and face the opening 117.

The movable portion 120 and the first and second fixed portions 130 and 140 are provided, respectively, with a movable electrode pad 161 and first and second fixed electrode pads 162 and 163, all of which are electrically connected to pads 301 provided to the circuit board 300 described below. More specifically, the location region of the movable electrode pad 161 is opposite to the location regions of the first and second fixed electrode pads 162 and 163. To be more exact, in a pair of opposing sides of the SOI substrate 114 (semiconductor layer 113), the movable electrode pad 161 is provided to the anchor portion 123a located near one side (upper side on the sheet surface of FIG. 4), and the first and second fixed electrode pads 162 and 163 are provided to predetermined positions in the first and second wiring portions 132 and 142 located near the other one side (lower side on the sheet surface of FIG. 4).

In the present embodiment, peripheral portion pads 164 electrically connected to the pads 301 of the circuit board 300 are provided at predetermined positions in the peripheral portion 150.

The above has described the configuration of the acceleration sensor 100 of the present embodiment, and the following will describe an operation of the acceleration sensor 100. In the acceleration sensor 100, as are indicated by capacitor symbols in FIG. 4, a first capacitance $C_{s1}$ is formed between the movable electrodes 124 and the first fixed electrodes 131. A second capacitance $C_{s2}$ is formed between the movable electrodes 124 and the second fixed electrodes 141. In order to detect acceleration, a pulse input signal (carrier wave) having predetermined amplitude and frequency is applied to the movable electrodes 124 (movable electrode pad 161) from the circuit board 300. When acceleration in a direction along the longitudinal direction of the weight portion 121 (alignment direction of the movable electrodes 124 and the first and second fixed electrodes 131 and 141) is applied, the first and second capacitances $C_{s1}$ and $C_{s2}$ vary with displacement of the movable electrodes 124. Hence, acceleration is detected according to a difference between the first and second capacitances $C_{s1}$ and $C_{s2}$ (potential across the first and second fixed electrode pads 162 and 163).

That is to say, in the present embodiment, the movable electrode pad 161 corresponds to an input terminal of the present disclosure, and the first and second fixed electrode pads 162 and 163 correspond to output terminals of the present disclosure. In the description below, the movable electrode pad 161 is referred to as the input terminal 161 of the acceleration sensor 100, and the first and second fixed electrode pads 162 and 163 are referred to as the output terminals 162 and 163 of the acceleration sensor 100. Constant potential is applied to the peripheral pads 164 to restrict fluctuation in potentials of the support substrate 111 and the peripheral portion 150.

A configuration of the angular velocity sensor 200 will now be described. The angular velocity sensor 200 of the present embodiment is known as a piezoelectric type angular velocity sensor, and outputs a second sensor signal of the present disclosure corresponding to an angular velocity. The angular velocity sensor 200 includes a sensor portion 210 shown in FIG. 6 and a support portion 220 shown in FIG. 7 and FIG. 8. The support portion 220 supports the sensor portion 210.

Figure 6:
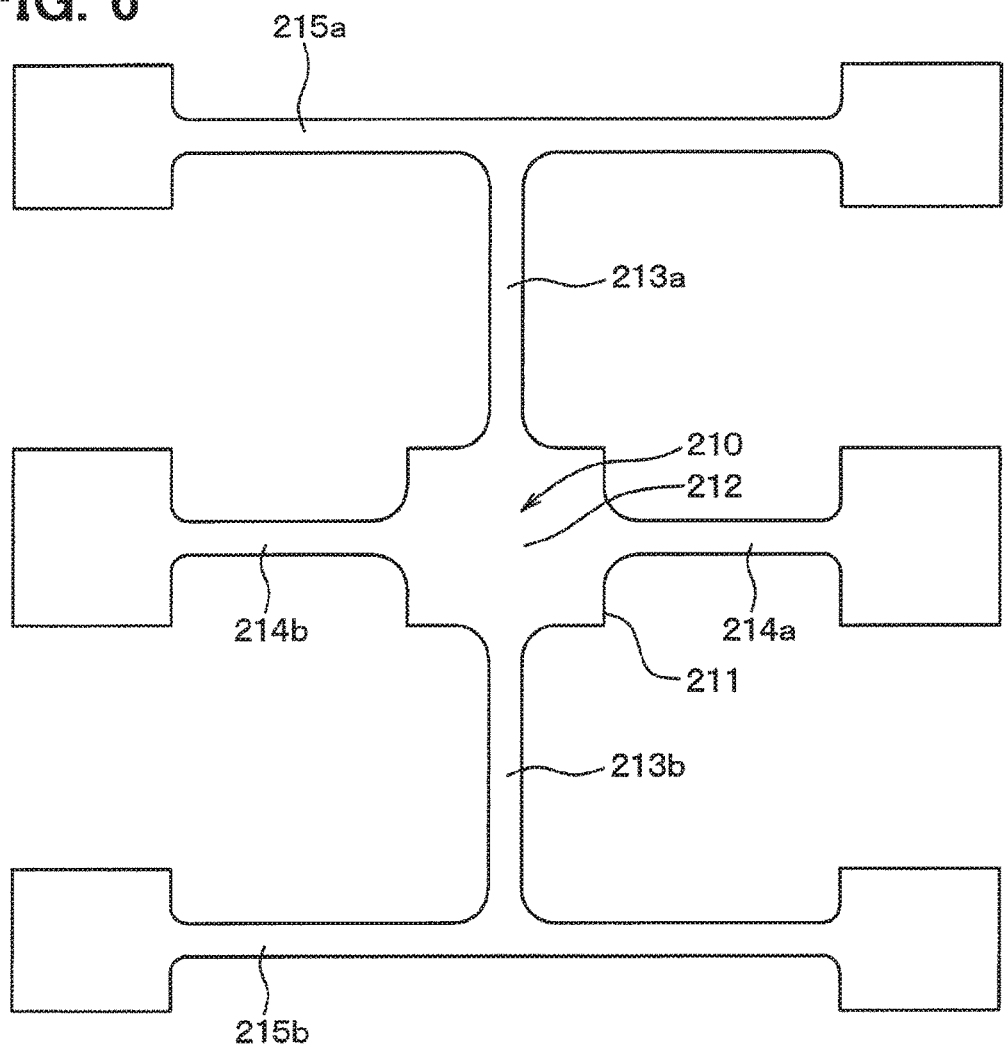
FIG. 6 is a top view of a sensor portion in an angular velocity sensor.
Figure 6:
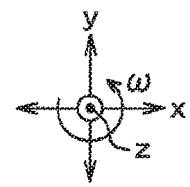

Firstly, a configuration of the sensor portion 210 will be described. As is shown in FIG. 6, the sensor portion 210 is manufactured by performing micro-machine processing to a substrate 211 made of a piezoelectric material, such as quartz, in a known manner. In FIG. 6, an x-axis direction is a right-left direction on a sheet surface of FIG. 6, a y-axis direction is a direction perpendicular to the x-axis direction in a planar direction of the substrate 211, and a z-axis direction is a direction perpendicular to both of the x-axis direction and the y-axis direction.

The sensor portion 210 is disposed on an x-y plane aligned with a crystal axis of quartz forming the substrate 211, and is disposed in a point symmetrical manner with respect to a center point. More specifically, the sensor portion 210 has a rectangular base 212. The base 212 includes first and second coupling portions 213a and 213b extending along the y-axis from substantial centers of respective two side surfaces of the base 212 which are parallel to an x-z plane. The base 21 includes first and second detection vibrating reeds 214a and 214b extending along the x-axis from substantial centers of respective two side surfaces of the base 212 which are parallel to a y-z plane. The first and second coupling portions 213a and 213b are provided to extend along the y-axis in opposite directions with respect to the base 212. Likewise, the first and second detection vibrating reeds 214a and 214b are provided to extend along the x-axis in opposite directions with respect to the base 212.

The first and second coupling portions 213a and 213b are provided, respectively, with first and second drive vibrating reeds 215a and 215b extending along the x-axis at respective tip ends on an opposite side to the base 212. The first and second drive vibrating reeds 215a and 215b are coupled, respectively, to the first and second coupling portions 213a and 213b at substantial centers in an extending direction.

Unillustrated electrodes are provided to the respective first and second detection vibrating reeds 214a and 214b and the respective first and second drive vibrating reeds 215a and 215b. To be more specific, unillustrated first and second detection electrodes are provided to the first and second detection vibrating reeds 214a and 214b, respectively. Unillustrated first and second drive electrodes are provided to the first and second drive vibrating reeds 215a and 215b, respectively.

Further, unillustrated six lands (electrode patterns) are provided to a surface of the base 212 on a side supported by the support portion 220. To be more specific, the base 212 is provided with a first detection land connected to the first detection electrode provided to the first detection vibrating reed 214a, and the base 212 is provided with a second detection land connected to the second detection electrode provided to the second detection vibrating reed 214b. The base 212 is provided with a first drive land connected to the first drive electrode provided to the first drive vibrating reed 215a, and the base is provided with a second drive land connected to the second drive electrode provided to the second drive vibrating reed 215b.

The base 212 is provided with first and second ground lands disposed between each of the first and second detection lands and each of the first and second drive lands, to reduce floating capacitances generated between each of the first and second detection lands and each of the first and second drive lands when ground potential is applied. The first and second detection lands, the first and second drive lands, and the first and second ground lands are electrically connected to the circuit board 300, respectively, via first through sixth leads 241 through 246 of the support portion 220 described below.

The above has described the configuration of the sensor portion 210 in the angular velocity sensor 200 of the present embodiment. The following will describe the support portion 220.

Figure 7:
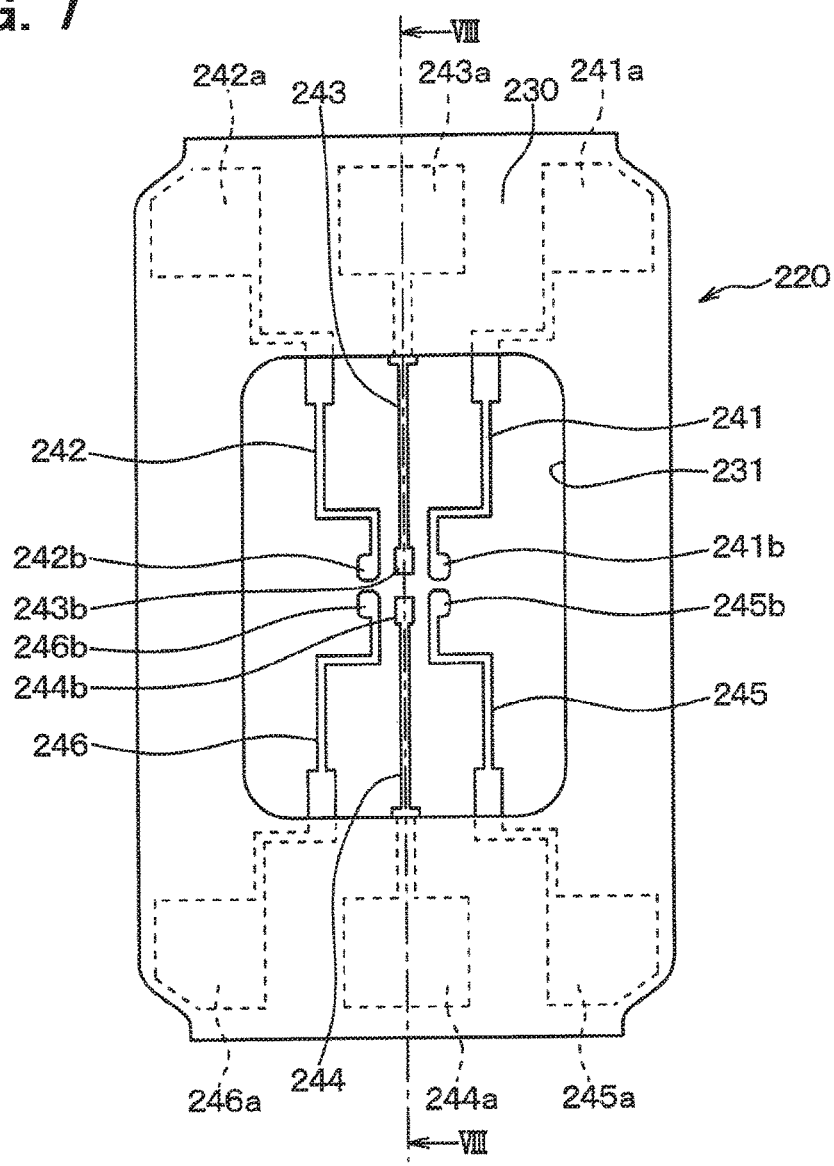
FIG. 7 is a top view of a support portion in the angular velocity sensor.
Figure 8:
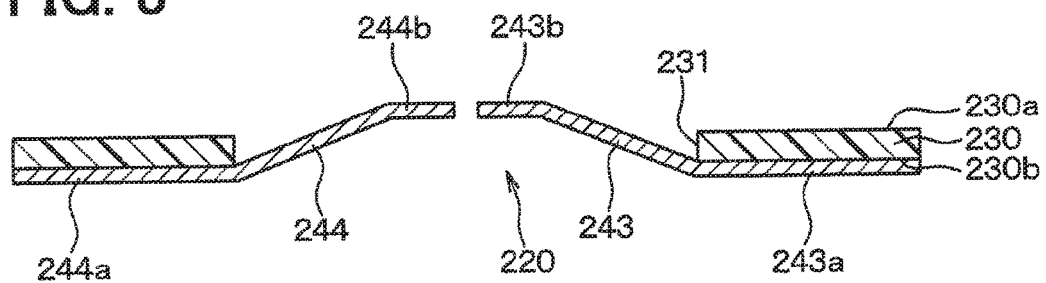
FIG. 8 is a sectional view taken along the line VIII-VIII of FIG. 7.

As are shown in FIG. 7 and FIG. 8, the support portion 220 is provided by a known TAB (tape automated bonding) tape which includes an insulation member 230 made of polyimide resin or the like and provided with the first through sixth leads 241 through 246 made of copper foil or the like. More specifically, the insulation member 230 is of substantially a rectangular planar shape, and provided with a device hole 231 substantially at a center. The first through sixth leads 241 through 246 are disposed in such a manner that one ends 241a through 246a are disposed close to a periphery of the device hole 231 on a side of a back surface 230b of the insulation member 230, and the other ends 241b through 246b are bent to protrude from inside portion of the device hole 231 toward a surface 230a of the insulation member 230.

One ends 241a through 246a of the first through sixth leads 241 through 246 are electrically connected, respectively, to connection terminals 41 through 46 provided to a case 20 described below. The first and second leads 241 and 242 are connected, respectively, to the first and second detection lands at the other ends 241b and 242b. The third and fourth leads 243 and 244 are connected, respectively, to the first and second drive lands at the other ends 243b and 244b. The fifth and sixth leads 245 and 246 are connected, respectively, to the first and second ground lands at the other ends 245b and 246b. With the above-described configuration, the sensor portion 210 is spaced apart from the insulation member 230.

A locational relation of the one ends 241a through 246a of the first through sixth leads 241 through 246, respectively, will now be described. In the present embodiment, as is shown in FIG. 7, when viewed in a direction normal to the surface 230a of the insulation member 230, the respective one ends 241a through 243a of the first through third leads 241 through 243 are disposed on opposite ends to the respective one ends 244a through 246a of the fourth through sixth leads 244 through 246.

More specifically, in a pair of opposing sides of the insulation member 230, the respective one ends 241a through 243a of the first through third leads 241 through 243 are disposed near one side (upper side on a sheet surface of FIG. 7), and the respective one ends 244a through 246a of the fourth through sixth leads 244 through 246 are disposed near the other one side (lower side on the sheet surface of FIG. 7). In other words, the respective one ends 241a through 243a of the first through third leads 241 through 243 are disposed in one region, and the respective one ends 244a through 246a of the fourth through sixth leads 244 through 246 are disposed in another region, and the one region and another region sandwich the device hole 231.

The above has described the configuration of the angular velocity sensor 200 of the present embodiment. The insulation member 230 of the support portion 220 is omitted in FIG. 1.

An operation of the angular velocity sensor 200 will now be described. In detection of an angular velocity with the angular velocity sensor 200, a pulse input signal (carrier wave) having predetermined amplitude and frequency is applied to the second drive vibrating reed 215b (the one end 244a of the fourth lead 244). Accordingly, the first and second drive vibrating reeds 215a and 215b are driven to vibrate oppositely along the y-axis in FIG. 6. In short, the first and second drive vibrating reeds 215a and 215b are driven to vibrate and open and close with each other.

While no angular velocity is applied, moments applied to the first and second detection vibrating reeds 214a and 214b, respectively, from the first and second drive vibrating reeds 215a and 215b are opposite and cancel out each other. Hence, the first and second detection vibrating reeds 214a and 214b are substantially in stationary state. In the present embodiment, an input signal inputted to the second drive vibrating reed 215b (the one end 244a of the fourth lead 244) is set at a frequency such that the input signal inputted to the second drive vibrating reed 215b and an input signal inputted to the acceleration sensor 100 are not combined to a high-order harmonic as high as or higher than a fifth order. Thus, the two input signals are hard to resonate with each other.

When electric charges generated at the first drive vibrating reed 215a (the one end 243a of the third lead 243) are outputted to the circuit board 300, an input signal inputted to the second drive vibrating reed 215b is adjusted by an electric charge amplifier and a synchronous detector circuit provided to the circuit board 300. That is, the fourth lead 244 connected to the second drive vibrating reed 215b functions as an input portion to which an input signal is inputted, and the one end 244a of the fourth lead 244 functions as an input terminal. Likewise, the third lead 243 connected to the first drive vibrating reed 215a functions as an output portion from which the electric charges are outputted to the circuit board 300, and the one end 243a of the third lead 243 functions as an output terminal. In the description below, the one end 243a of the third lead 243 is referred to as the output terminal 243a, and the one end 244a of the fourth lead 244 as the input terminal 244a.

When an angular velocity ω is applied about the z-axis direction in a state as above, the first and second drive vibrating reeds 215a and 215b vibrate oppositely in the x-axis direction due to a Coriolis force. The first and second detection vibrating reeds 214a and 214b thus vibrate oppositely in a circumferential direction about the z-axis direction. Eventually, electric charges corresponding to the vibrations are generated at the unillustrated first and second detection electrodes (the one ends 241a and 242a of the first and second leads 241 and 242, respectively) provided to the first and second detection vibrating reeds 214a and 214b, respectively. An angular velocity is detected when the electric charges are outputted to the circuit board 300. That is to say, the respective one ends 241a and 242a of the first and second leads 241 and 242 connected, respectively, to the first and second detection vibrating reeds 214a and 214b function as output terminals. In the description below, the respective one ends 241a and 242a of the first and second leads 241 and 242 are referred to as the output terminals 241a and 242a.

The circuit board 300 is provided with various circuits applying predetermined processing on the acceleration sensor 100 and the angular velocity sensor 200. The various circuits may include, such as an amplifier circuit, an electric charge amplifier, a synchronous detector circuit, and a comparator. As shown in FIG. 1, the circuit board 300 further includes multiple pads 301. In the present embodiment, the circuit board 300 outputs an analog signal to an external circuit according to signals outputted from the output terminals 162 and 163 of the acceleration sensor 100 and signals outputted from the output terminals 241a and 242a of the angular velocity sensor 200.

A structure of the package 10 will now be described.

As shown in FIG. 2 and FIG. 3, the package 10 includes the case 20 and the lid 60. The case 20 includes a laminated substrate having multiple laminated ceramic layers made of alumina or the like, and has a box shape with a recess 30 provided to one surface 20a. In the present embodiment, the recess 30 includes a first recess 31, a second recess 32 provided at a bottom of the first recess 31, and a third recess 33 provided at a bottom of the second recess 32. As are shown in FIG. 1 and FIG. 3, the case 20 is provided with the first through sixth connection terminals 41 through 46 at the bottom of the first recess 31. Also, as are shown in FIG. 1 and FIG. 2, multiple connection terminals 51 are provided at the bottom of the second recess 32. The first through sixth connection terminals 41 through 46 and the multiple connection terminals 51 are electrically connected as needed via an unillustrated wiring layer provided inside the case 20 and on wall surfaces or the like of the first through third recesses 31 through 33.

External connection terminals connected to the multiple connection terminals 51 via the unillustrated wiring layer are provided outside of the case 20 to establish a connection with an external circuit.

The lid 60 is made of metal or the like, and is bonded to the one surface 20a of the case 20 by welding or the like. The case 20 is thus closed and an interior of the case 20 is hermetically sealed. In the present embodiment, the interior of the case 20 is at a vacuum pressure.

The package 10 as above houses the acceleration sensor 100, the angular velocity sensor 200, and the circuit board 300. More specifically, as are shown in FIG. 1 through FIG. 3, the circuit board 300 is mounted on a bottom surface 33a of the third recess 33 via an adhesive 71. When viewed in a direction normal to the bottom surface 33a of the third recess 33 (hereinafter, referred to simply as the normal direction), the acceleration sensor 100 and the angular velocity sensor 200 are disposed side by side on the circuit board 300 (inside the case 20). To be more exact, as are shown in FIG. 1 and FIG. 2, the acceleration sensor 100 is mounted on the circuit board 300 via an adhesive 72. The input terminal 161, the output terminals 162 and 163, and the peripheral portion pads 164 are electrically connected to the pads 301 of the circuit board 300 via wires 81 as needed. As to the angular velocity sensor 200, the respective one ends 241a through 246a of the first through sixth leads 241 through 246 are electrically and mechanically connected, respectively, to the first through sixth connection terminals 41 through 46 provided at the bottom of the second recess 32 via an unillustrated conductive member, such as solder. Thus, the sensor portion 210 is afloat in midair in an internal space of the case 20. In short, the angular velocity sensor 200 is housed in the case 20 and is spaced apart from the circuit board 300. In the present embodiment, the bottom surface 33a of the third recess 33 corresponds to one surface of the mount member of the present disclosure, and it can be said that the acceleration sensor 100 and the angular velocity sensor 200 are located on the one surface of the mount member.

To be more exact, as described above, the input terminal 161 of the acceleration sensor 100 is disposed on opposite side from (spaced apart from) the output terminals 162 and 163 of the acceleration sensor 100. Likewise, as has been described above, the input terminal 244a of the angular velocity sensor 200 is disposed on opposite side from (spaced apart from) the output terminals 241a through 243a of the angular velocity sensor 200. As is shown in FIG. 1, the input terminal 161 of the acceleration sensor 100 and the input terminal 244a of the angular velocity sensor 200 are disposed on a same side, and the output terminals 162 and 163 of the acceleration sensor 100 and the output terminals 241a through 243a of the angular velocity sensor 200 are disposed on another same side. That is to say, suppose that a straight line passing respective centers of the acceleration sensor 100 and the angular velocity sensor 200 in a direction along an alignment direction of the acceleration sensor 100 and the angular velocity sensor 200 is defined as a virtual line K. The input terminal 161 of the acceleration sensor 100 and the input terminal 244a of the angular velocity sensor 200 are disposed on a side of one region divided by the virtual line K (on lower side below the virtual line K on a sheet surface of FIG. 1). The output terminals 162 and 163 of the acceleration sensor 100 and the output terminals 241a through 243a of the angular velocity sensor 200 are disposed on a side of the other region (on upper side above the virtual line K on the sheet surface of FIG. 1). In other words, the low-impedance input terminal 161 of the acceleration sensor 100 and the low-impedance input terminal 244a of the angular velocity sensor 200 are disposed in one of the two regions divided by the virtual line K (on lower side below the virtual line K on the sheet surface of FIG. 1), and the high-impedance output terminals 162 and 163 of the acceleration sensor 100 and the high-impedance output terminals 241a through 243a of the angular velocity sensor 200 are disposed in the remaining one of the two regions divided by the virtual line K (on upper side above the virtual line K on the sheet surface of FIG. 1).

Some of the pads 301 provided to the circuit board 300 are not connected to the respective pads 161 through 164 of the acceleration sensor 100, and electrically connected to the connection terminals 51 provided at the bottom of the second recess 32 via wires 82 as needed. As is shown in FIG. 2, the wire 82 is bent and disposed between the pad 301 and the connection terminal 51. It should be noted, however, that a portion of the wire 82 most remotely spaced apart from the bottom surface 33a of the third recess 33 is disposed at a position closer to the bottom surface 33a of the third recess 33 than a portion of the acceleration sensor 100 located on an opposite side to the circuit board 300 (one surface of the semiconductor layer 113 shown in FIG. 5 on an opposite side to the insulation film 112).

As described above, in the present embodiment, the input terminal 161 of the acceleration sensor 100 and the input terminal 244a of the angular velocity sensor 200 are disposed in one of the two regions divided by the virtual line K, and the output terminals 162 and 163 of the acceleration sensor 100 and the output terminals 241a through 243a of the angular velocity sensor 200 are disposed in the remaining one of the two regions divided by the virtual line K. As described above, the input signals readily becomes a noise source, and the output signals are susceptible to noise. In the above configuration, the input terminals 161 and 244a to which the input signals are inputted are apart from the output terminals 162, 163, and 241a through 243a from which the output signals are outputted. Hence, adverse effect caused by the signals inputted to the input terminals 161 and 244a on signals outputted from the output terminals 162, 163, and 241a through 243a can be restricted. Consequently, deterioration of detection accuracy can be restricted.

As described above, the input terminal 161 of the acceleration sensor 100 together with the input terminal 244a of the angular velocity sensor 200 are disposed collectively on a same side. The output terminals 162, 163 of the acceleration sensor 100 together with the output terminals 241a through 243a of the angular velocity sensor 200 are disposed collectively on another same side. Hence, the wiring layer provided inside the case 20 and on the wall surfaces or the like of the first through third recesses 31 through 33 can be easily and simply designed (routed).

A portion of the wire 82 most remotely spaced apart from the bottom surface 33a of the third recess 33 is disposed at a position closer to the bottom surface 33a of the third recess 33 than a portion of the acceleration sensor 100 disposed on the opposite side to the circuit board 300 (one surface of the semiconductor layer 113 on the opposite side to the insulation film 112). In short, the wire 82 is cut shorter. Hence, a parasitic capacitance generated at the wire 82 can be reduced. Consequently, an adverse effect caused by the parasitic capacitance on detection accuracy can be restricted.

In the present embodiment, the acceleration sensor 100 is of a capacitive type, and the angular velocity sensor 200 is of a piezoelectric type. Hence, the angular velocity sensor 200 achieves higher sensitivity by narrowing a resonance frequency range. Meanwhile, the acceleration sensor 100 becomes capable of restricting deterioration of detection accuracy caused by vibrations of the angular velocity sensor 200 by increasing Q-value.

The acceleration sensor 100 is mounted on the bottom surface 33a of the third recess 33 via the circuit board 300, and the angular velocity sensor 200 is connected to the first through sixth connection terminals 41 through 46 provided at the bottom of the first recess 31. In short, the acceleration sensor 100 and the angular velocity sensor 200 are bonded to different regions. Hence, transmission of vibrations of the angular velocity sensor 200 to the acceleration sensor 100 can be restricted. Consequently, deterioration of detection accuracy of the acceleration sensor 100 caused by mechanical noise (vibrations of the angular velocity sensor 200) can be restricted as well.

Second Embodiment

A second embodiment of the present disclosure will be described.

The present embodiment is different from the above-described first embodiment in that a first reference potential terminal is provided. Since remaining part of the present embodiment is similar to the first embodiment, a description of the similar part will be omitted.

Figure 9:
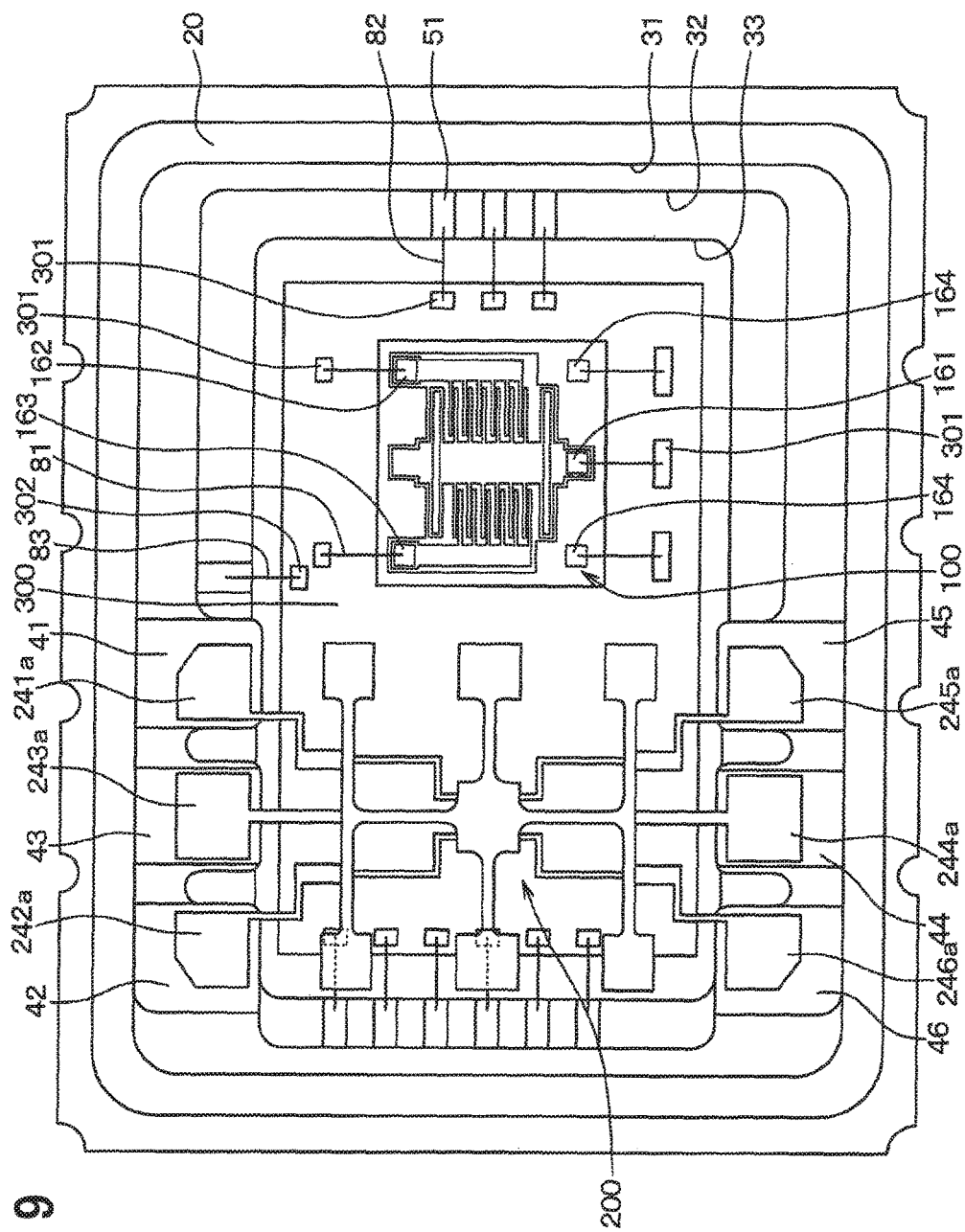
FIG. 9 is a top view of a composite sensor according to a second embodiment of the present disclosure.

In the present embodiment, as is shown in FIG. 9, when viewed in a normal direction, a circuit board 300 is provided with a first reference potential terminal 302 in a portion different from a portion where an acceleration sensor 100 and an angular velocity sensor 200 overlap the circuit board 300. More specifically, when viewed in the normal direction, the first reference potential terminal 302 is provided between output terminals 162, 163 of the acceleration sensor 100 and output terminals 241a through 243a of the angular velocity sensor 200. To be more exact, a distance from the angular velocity sensor 200 to the first reference potential terminal 302 is shorter than a distance from the angular velocity sensor 200 to each of the pads 301 of the circuit board 300 connected to the output terminals 162 and 163 of the acceleration sensor 100.

The first reference potential terminal 302 is fixed at predetermined potential by being electrically connected to one of connection terminals 51 provided at a bottom of a second recess 32 via a wire 83. That is to say, the wire 83 is provided between wires 81 connecting the output terminals 162, 163 of the acceleration sensor 100 to the corresponding pads 301 of the circuit board 300 and a connection portion connecting the output terminals 241a through 243a of the angular velocity sensor 200 to the first through third connection terminals 41 through 43 provided at a bottom of a first recess 31.

In the above-described configuration, because the wire 83 is fixed at predetermined potential, the wire 83 functions as an interference restricting body (guard ring). Hence, noise which is caused by an electrical signal of one of the acceleration sensor 100 or the angular velocity sensor 200 and affects the other sensor can be restricted. Consequently, deterioration of detection accuracy can be restricted. In the present embodiment, deterioration of detection accuracy can be restricted further particularly because the wire 83 is disposed between the output terminals 162 and 163 of the acceleration sensor 100 and the output terminals 241a through 243a of the angular velocity sensor 200. As described above, the output terminals are susceptible to noise.

Third Embodiment

A third embodiment of the present disclosure will be described. The present embodiment is different from the above-described first embodiment in that a digital signal is outputted from a circuit board 300. Since remaining part of the present embodiment is similar to the first embodiment, a description of the similar part will be omitted.

Figure 10:
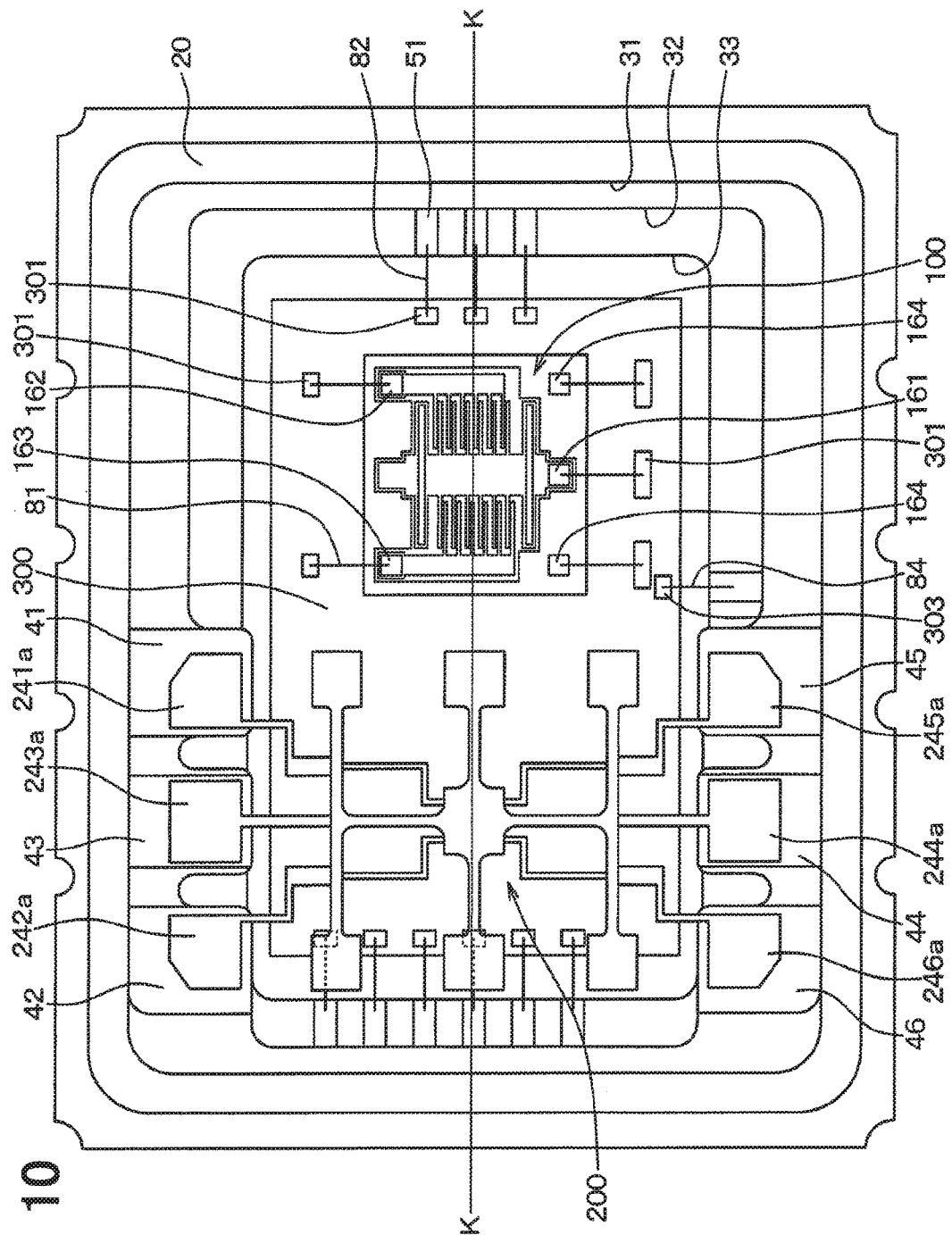
FIG. 10 is a top view of a composite sensor according to a third embodiment of the present disclosure.

In the present embodiment, as is shown in FIG. 10, the circuit board 300 has a communication terminal 303 connected to an external circuit. Analog signals (sensor signals) outputted from an acceleration sensor 100 and an angular velocity sensor 200 are converted to digital signals and outputted to external according to a pulse signal inputted from the external circuit via the communication terminal 303.

The communication terminal 303 is disposed in one of the two regions divided by a virtual line K where an input terminal 161 of the acceleration sensor 100 and an input terminal 244a of the angular velocity sensor 200 are disposed (a region below the virtual line K on a sheet surface of FIG. 10). More specifically, when viewed in a normal direction, the communication terminal 303 is provided between the input terminal 161 of the acceleration sensor 100 and the input terminal 244a of the angular velocity sensor 200. To be more exact, a distance from the angular velocity sensor 200 to the communication terminal 303 is shorter than a distance from the angular velocity sensor 200 to a pad 301 of the circuit board 300 connected to the input terminal 161 of the acceleration sensor 100. The communication terminal 303 is electrically connected to one of connection terminals 51 provided at a bottom of a second recess 32 via a wire 84.

When configured in the manner as above, the circuit board 300 outputs a digital signal according to a pulse signal from an external circuit, and the pulse signal becomes a noise source. By disposing the communication terminal 303 to which a noise source is inputted in one of the two regions divided by the virtual line K where the input terminal 161 of the acceleration sensor 100 and the input terminal 244a of the angular velocity sensor 200 are also disposed, an adverse effect caused by the pulse signal on signals outputted from output terminals 162, 163, and 241a through 243a can be restricted. Consequently, deterioration of detection accuracy can be restricted.

Fourth Embodiment

A fourth embodiment of the present disclosure will be described. The present embodiment is different from the above-described third embodiment in that second reference potential terminals are provided to a circuit board 300. Since remaining part of the present embodiment is similar to the third embodiment, a description of the similar part will be omitted.

Figure 11:
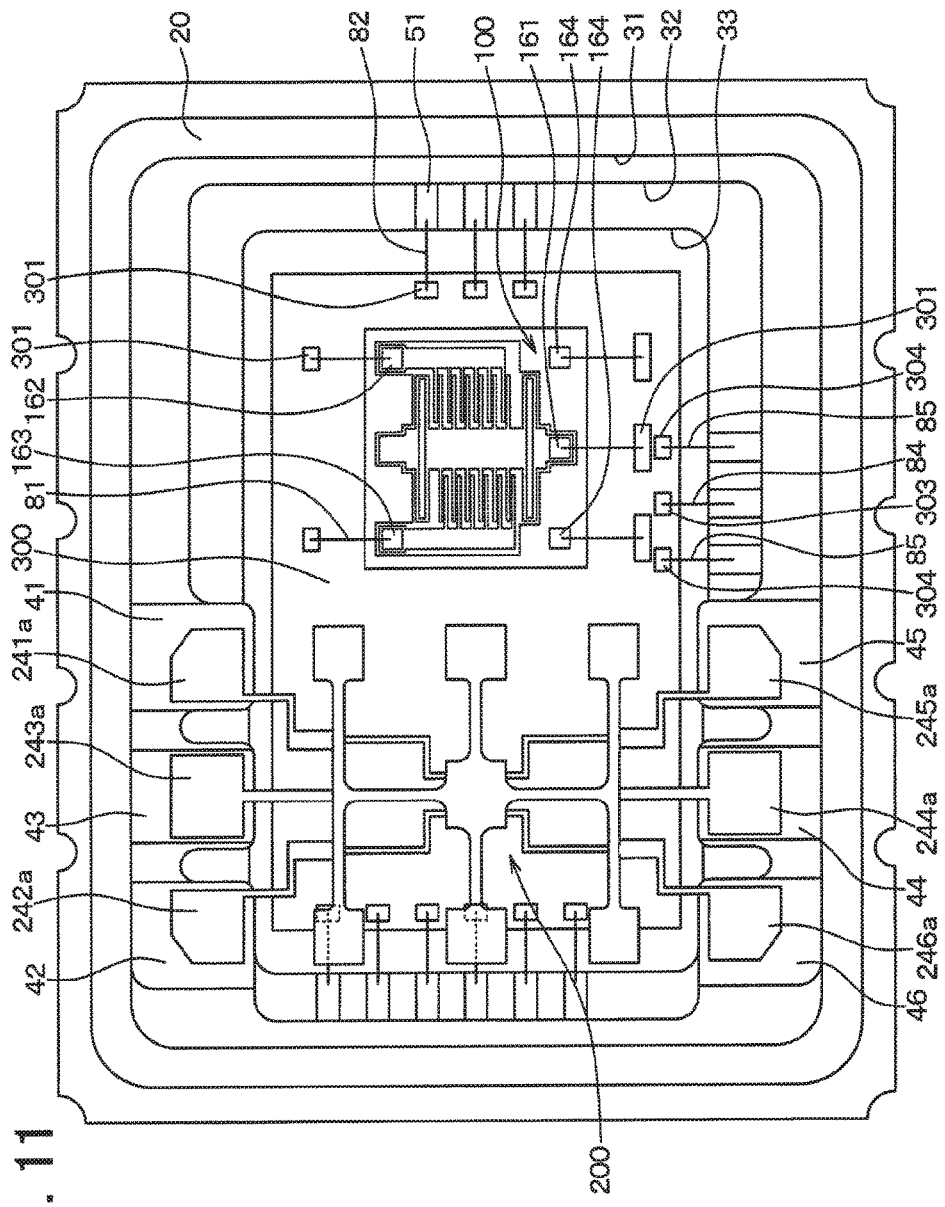
FIG. 11 is a top view of a composite sensor according to a fourth embodiment of the present disclosure.

In the present embodiment, as is shown in FIG. 11, when viewed in a lamination direction, the circuit board 300 is provided with second reference potential terminals 304 that sandwich a communication terminal 303 therebetween. Each of the second reference potential terminals 304 is fixed at predetermined potential by being electrically connected to one of connection terminals 51 provided at a bottom of a second recess 32 via a wire 85. That is to say, the wires 85 are provided to sandwich a wire 84 which connects the communication terminal 303 and one of the connection terminals 51.

With the above-described configuration, the wires 85 electrically connected to the respective second reference potential terminals 304 function as an interference restricting body. Consequently, adverse effect caused by a pulse signal inputted to the communication terminal 303 and propagating as a noise source can be restricted.

Other Embodiments

It should be appreciated that the present disclosure is not limited to the embodiments described above and can be modified as needed within the scope and sprit of the appended claims.

For example, in the respective embodiments above, the acceleration sensor 100 may detect acceleration only in one predetermined direction. In the respective embodiments above, a combination of the first and second sensors can be changed as needed under a condition that the first and second sensors detect different subjects from one another. For example, the first sensor may be an acceleration sensor 100 which detects acceleration only in one predetermined direction and the second sensor may be another acceleration sensor 100 which detects acceleration only in one direction perpendicular to the one predetermined direction.

In the respective embodiments above, when detecting acceleration with the acceleration sensor 100, a pulse input signal (carrier wave) having predetermined amplitude and frequency may be applied from the circuit board 300 to the first and second fixed electrodes 131 and 141 (first and second fixed electrode pads 162 and 163). When the acceleration sensor configured as above is used, the first and second fixed electrode pads 162 and 163 function as input terminals and the movable electrode pad 161 functions as an output terminal.

In the respective embodiments above, capacitive type angular velocity sensor may be used as the angular velocity sensor 200.

In the second embodiment above, for example, the first reference potential terminal 302 may be provided between the input terminal 161 of the acceleration sensor 100 and the input terminal 244a of the angular velocity sensor 200 (near the communication terminal 303 of FIG. 10). Alternatively, the first reference potential terminal 302 may be provided between the output terminals 162 and 163 and the input terminal 161 of the acceleration sensor 100 (near the pads 301 on the right side of the acceleration sensor 100 on the sheet surface of FIG. 9). Even when the first reference potential terminal 302 is provided in different manners as above, the wire 82 connected to the first reference potential terminal 302 functions as an interference restriction body. Consequently, deterioration of detection accuracy can be restricted. Further, more than one first reference potential terminal 302 may be provided and each may be electrically connected to one connection terminal 51 via the wire 82.

The respective embodiments above may be combined with one another appropriately. For example, the second embodiment may be combined with the third or fourth embodiment so that the sensor includes the first reference potential terminal 302 and the communication terminal 303.

While the disclosure has been described with reference to preferred embodiments thereof, it is to be understood that the disclosure is not limited to the preferred embodiments and constructions. The disclosure is intended to cover various modification and equivalent arrangements. In addition, the various combinations and configurations, which are preferred, other combinations and configurations, including more, less or only a single element, are also within the spirit and scope of the disclosure.

The invention claimed is:
1. A composite sensor comprising:
a first sensor outputting a first sensor signal corresponding to a detection subject;
a second sensor outputting a second sensor signal corresponding to a detection subject different from the detection subject of the first sensor;
a circuit board electrically connected to the first sensor and the second sensor; and
a mount member having one surface, wherein the first sensor, the second sensor, and the circuit board are disposed on the one surface of the mount member,
the first sensor and the second sensor have respective input terminals to which respective input signals having predetermined amplitudes and predetermined frequencies are inputted,
the first sensor and the second sensor have respective output terminals, the first sensor signal being outputted from the output terminal of the first sensor, and the second sensor signal being outputted from the output terminal of the second sensor,
when viewed in a direction normal to the one surface, the first sensor and the second sensor are arranged along a direction,
a virtual line is defined by, as seen in a top view of the composite sensor, a straight line which passes through respective centers of the first sensor and the second sensor and is parallel to an arrangement direction of the first sensor and the second sensor, and
the respective input terminals of the first sensor and the second sensor are disposed in one of two regions divided by the virtual line, and the respective output terminals of the first sensor and the second sensor are disposed in a remaining one of the two regions divided by the virtual line, each of the first sensor and second sensor includes a plurality of output terminals including the respective output terminal and an approximately rectangular planar member, the approximately rectangular planar member has a first side and a second side which are parallel to the virtual line and are located on opposite sides of the virtual line, in the first sensor, the input terminal is disposed adjacent to the first side of the approximately rectangular planar member, and the plurality of output terminals is disposed adjacent to the second side of the approximately rectangular planar member, in the second sensor, the input terminal is disposed adjacent to the first side of the approximately rectangular planar member, and the plurality of output terminals is disposed adjacent to the second side of the approximately rectangular planar member.

2. The composite sensor according to claim 1, wherein:
the mount member has a connection terminal;
the circuit board has a first reference potential terminal disposed at a portion different from respective portions where the first sensor and the second sensor are arranged when viewed in the direction normal to the one surface; and
the first reference potential terminal is fixed at a predetermined potential by being electrically connected, via a wire, to the connection terminal of the mount member.

3. The composite sensor according to claim 2, wherein:
when viewed in the direction normal to the one surface, the first reference potential terminal is disposed at least one of a position between the input terminal of the first sensor and the input terminal of the second sensor or a position between the output terminal of the first sensor and the output terminal of the second sensor; and
the wire connecting the first reference potential terminal and the connection terminal functions as an interference restricting body between the first sensor and the second sensor.

4. The composite sensor according to claim 1, wherein:
the first sensor and the second sensor output respective analog signals to the circuit board as the first sensor signal and the second sensor signal, respectively;
the circuit board has a communication terminal that converts the first sensor signal and the second sensor signal to respective digital signals, and outputs the respective digital signals according to a pulse signal inputted from an external circuit; and when viewed in the direction normal to the one surface, the communication terminal is disposed together with the respective input terminals of the first sensor and the second sensor in the one of the two regions divided by the virtual line.

5. The composite sensor according to claim 4, wherein:
the mount member has a connection terminal;
the circuit board has two second reference potential terminals which sandwich the communication terminal;
the two second reference potential terminals are fixed at respective predetermined potentials by being electrically connected to the connection terminal via respective wires; and
the respective wires connecting the two second reference potential terminals and the connection terminal function as interference restricting bodies between the communication terminal and both of the first sensor and the second sensor.

6. The composite sensor according to claim 1, wherein:
the mount member has a connection terminal;
the first sensor is mounted on the circuit board;
the circuit board has a plurality of pads electrically connected to the connection terminal via respective wires;
each of the wires has a bent shape and is disposed between each of the plurality of pads and the connection terminal; and
in each of the wires, a portion most remotely spaced from the one surface is located closer to the one surface than a portion of the first sensor disposed opposite to the circuit board.

7. The composite sensor according to claim 1, wherein:
the first sensor is an acceleration sensor having a movable electrode and a fixed electrode, the movable electrode is displaceable according to an acceleration, the fixed electrode is opposed to the movable electrode, and the first sensor outputs the first sensor signal according to a capacitance between the movable electrode and the fixed electrode; and
the second sensor is an angular velocity sensor having a sensor portion made of a piezoelectric material and a support portion having a plurality of leads, the sensor portion is supported to be afloat in midair by respective ends of the plurality of leads, the input terminal and the output terminal are provided by respective different ends of the plurality of leads on an opposite side to the sensor portion, and the second sensor outputs the second sensor signal corresponding to an angular velocity when the angular velocity is applied during a vibration state of the sensor portion.

* * * * *